United States Patent [19]

Elabd et al.

[11] Patent Number: 4,658,278
[45] Date of Patent: Apr. 14, 1987

[54] HIGH DENSITY CHARGE-COUPLED DEVICE IMAGER AND METHOD OF MAKING THE SAME

[75] Inventors: Hammam Elabd, East Windsor; Walter F. Kosonocky, Skillman, both of N.J.

[73] Assignee: RCA Corporation, Princeton, N.J.

[21] Appl. No.: 723,150

[22] Filed: Apr. 15, 1985

[51] Int. Cl.[4] ............... H01L 29/78; H01L 27/14; H01L 31/00; G11C 19/28
[52] U.S. Cl. ............................. 357/24; 357/30; 357/59; 377/62
[58] Field of Search .............. 357/24, 30, 59, 25; 377/57–63

[56] References Cited

U.S. PATENT DOCUMENTS

| | | | |
|---|---|---|---|
| 3,911,467 | 10/1975 | Levine et al. | 357/24 LR |
| 4,206,371 | 6/1980 | Weimer | 357/24 M |
| 4,236,830 | 12/1980 | Schlig | 357/24 R |
| 4,246,591 | 1/1981 | Kosonocky et al. | 357/24 M |
| 4,362,575 | 12/1982 | Wallace | 148/1.5 |
| 4,468,684 | 8/1984 | Esser et al. | 357/24 M |

FOREIGN PATENT DOCUMENTS

| | | | |
|---|---|---|---|
| 106286 | 4/1984 | European Pat. Off. | |
| 58-199557 | 11/1983 | Japan | 357/59 G |

Primary Examiner—Gene M. Munson
Attorney, Agent, or Firm—Birgit E. Morris; Donald S. Cohen

[57] ABSTRACT

The present invention relates to a frame transfer charge-coupled device imager which includes along a major surface of a substrate of semiconductor material a photosensing array A-register, a temporary storage B-register and an output C-register. The C-register includes a channel region in the substrate and extending along the substrate surface across the ends of and substantially perpendicular to spaced, parallel channel regions of the B-register. The C-register also includes a plurality of parallel, conductive gates extending transversely across the C-register channel region substantially parallel to the B-register channel regions. The gates include a plurality of sets with a plurality of gates per set. One gate of each set extends to a conductive termination which extends along one side of the C-register channel region over the B-register and the gates of the other sets extend to conductive terminations which are along the side of the C-register channel region opposite the B-register. At least one gate of each set extends over an end portion of a separate one of the B-register channel regions. The end portions of the B-register channel regions are made to extend directly under and be aligned with the gates of the C-register which extend over the channel region.

7 Claims, 7 Drawing Figures

HIGH DENSITY CHARGE-COUPLED DEVICE IMAGER AND METHOD OF MAKING THE SAME

The present invention relates to a high density frame transfer charge-coupled device (CCD) imager and a method of making the same. More particularly, the present invention relates to the output register, the C-register, of a high density frame transfer CCD imager and method of making the same.

BACKGROUND OF THE INVENTION

A frame transfer CCD imager generally includes three parts: a photosensing array, known as the A-register; a temporary storage array, known as the B-register; and an output register, known as the C-register. Each of the A-register and the B-register includes a plurality of parallel channel regions in a substrate of single crystalline silicon and extending along a surface of the substrate. The channel regions of the B-register are extensions of the channel regions of the A-register. Between the channel regions are channel stop regions which isolate the channels from each other. As described by L. F. Wallace in U.S. Pat. No. 4,362,575, issued Dec. 7, 1982, entitled "Method of Making Buried Channel Charge-Coupled Device With Means for Controlling Excess Charge", a blooming drain can be provided between the channels of the A-register to collect any excess charge from the channels. Each of the A-register and B-register has a plurality of parallel conductive gates extending transversely across the channels and insulated from the substrate by a layer of an insulating material, such as silicon oxide. The C-register includes a single channel region in the substrate extending transversely across the ends of the B-register channels. A plurality of parallel conductive gates extends transversely across the C-register channel in a direction substantially parallel to the B-register channels. The C-register gates are insulated from the substrate surface by a layer of insulating material, such as silicon oxide.

In each of the registers the gates are arranged in sets with the common gates of each set being electrically connected together. Thus, the first gates of each set are connected together, the second gates of each set are connected together, etc. The number of gates in each set depends on the number of phases of the CCD. For a three phase CCD there are three gates per set, a four phase CCD has four gates per set, etc. The common gates are either connected together by a conductive termination strip or extend to conductive termination pads, which are part of the conductive layer which forms the gates, and which have contacts to which the termination wires can be connected. In the A-register and B-register the termination strips or pads are generally along one side of the register array. In the C-register the termination strips or pads are along the side of the channel away from the B-register. Also, the gates are generally formed from one or more layers of the conductive material, such as conductive polycrystalline silicon. For a two or four phase CCD, the gates are generally formed from two layers of the conductive material with at least one sets of gates being formed from each of the layers which are insulated from each other by a layer of silicon oxide.

The trend in semiconductor integrated circuits, including CCD imagers, is to make the device denser using narrower conductive lines and smaller related regions in the semiconductor substrate. For a CCD imager this allows an imager having a given size array to be made on a smaller substrate, or an imager having a larger array to be formed on the same size substrate. However, making the CCD imager denser raises a problem of where to place the termination strips or pads since the termination strips or pads must be relatively larger than the gates to allow terminal wires to be connected thereto. In the A-register and B-register, this problem can be handled by arranging some of the termination strips or pads along one side of the array and the others along the other side of the array. However, the problem still exists in the C-register which has only one side along which the termination strips or pads can be easily arranged.

Another problem which arises in making denser CCD imagers is in making the electrical connection between the buried channel regions of the B-register and the buried channel region of the C-register. This connection is generally achieved by having each of the B-register buried channel regions extend under the C-register gates so that a potental applied to the C-register gates will transfer charge from the B-register channel region to the C-register channel region. In order to achieve this transfer with good efficiency, the end of the B-register buried channel region should extend completely under the C-register gates. However, in a dense imager, the B-register buried channel may not extend completely under the C-register gates leaving some portions exposed, i.e. not covered. This can result from either the difference in width of the B-register channels, which are in the order of 8 micrometers in width, and the C channel gates, which are in the order of 4 micrometers in width, or by misalignment of the masks used to form the channels and gates. The exposed portions of the B-register buried channels will provide wells which can trap charges in the B-register channels and prevent such charges from being transferred to the C-register channel. Thus, it is necessary to align as much of the B-register channel regions as possible with the C-register gates to eliminate any exposed portions of the B-register channel region which can form charge trapping pockets.

SUMMARY OF THE INVENTION

The present invention relates to an improvement in a charge-coupled device imager of the type which includes in a substrate of semiconductor material having a major surface an A-register, a B-register and a C-register. The A-register and B-register have a plurality of spaced, parallel channel regions in the substrate and extending along the major surface of the substrate with the B-register channel regions being extensions of the A-register channel regions. A plurality of conductive gates extend transversely across the channel regions and are insulated from the major surface. The C-register includes a channel region in the substrate and extending along the major surface substantially perpendicular to and across the ends of the B-register channel regions. A plurality of conductive gates extend transversely across the C-register channel region substantially parallel to the B-register channel regions and are insulated from the major surface. The improvement is in having the gates of the C-register arranged in a plurality of sets with one gate of each set extending to conductive termination means which are along the side of the C-register channel region, over and insulated from the B-register, and the gates of the other sets extend to conductive termination means which are along the side of the C-register channel opposite to the B-register.

Another feature of the present invention is in having the end of each B-register channel region extending completely under the gates of the C-register and a method of aligning the B-register channels with the gates of the C-register.

DETAILED DESCRIPTION OF PREFERRED EMBODIMENT

Figure 1:
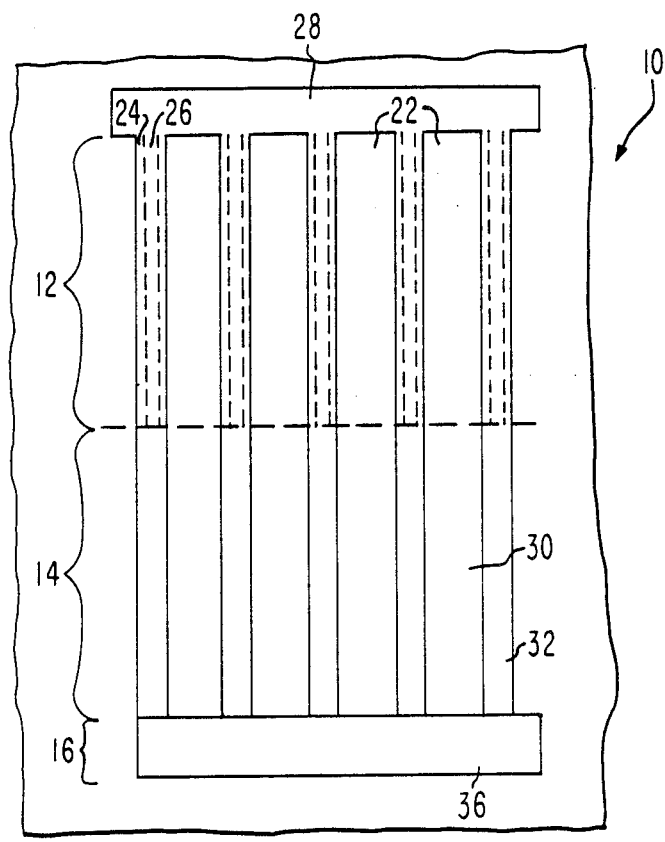
FIG. 1 is a schematic block diagram of a CCD imager which can incorporate the present invention.

Referring initially to FIG. 1, a frame transfer CCD imager which can incorporate the present invention is generally designated as 10. The CCD imager 10 includes a photosensing array 12, known as an A-register, a temporary storage array 14, known as a B-register, and an output register 16, known as a C-register. The B- and C-registers 14 and 16 are masked, that is, means (not shown) are provided for preventing a radiant energy image from reaching either register.

As shown in FIGS. 3-6, the CCD imager 10 is formed along the surface 18 of a substrate 20 of single crystalline silicon of P type conductivity. As shown in FIG. 1, the A-register 12 includes a plurality of spaced, parallel channel regions 22 of N type conductivity within the substrate 20 and extending along the surface 18. Between the channel regions 22 in the A-register 12 are channel stop regions 24 of N-type conductivity which serve to isolate the channel regions 22 from each other. Within the channel stop regions 24 are blooming drain regions 26 of N+ type conductivity. The previously referred to Wallace U.S. Pat. No. 4,362,575 explains how to form the channel stop regions 24 and blooming drain regions 26 and their purposes. At the end of the A-register 12, away from the B-register 14, a connecting region 28 of N+ type conductivity is within the substrate 20 and extends along the surface 18. As shown in FIG. 1, the connecting region 28 extends transversely across and is connected to the ends of the blooming drains 26. As in any CCD imager, a plurality of conductive gates (not shown) extends transversely across the channels 22 and is insulated from the substrate surface 18 by a thin layer of silicon oxide.

Figure 2:
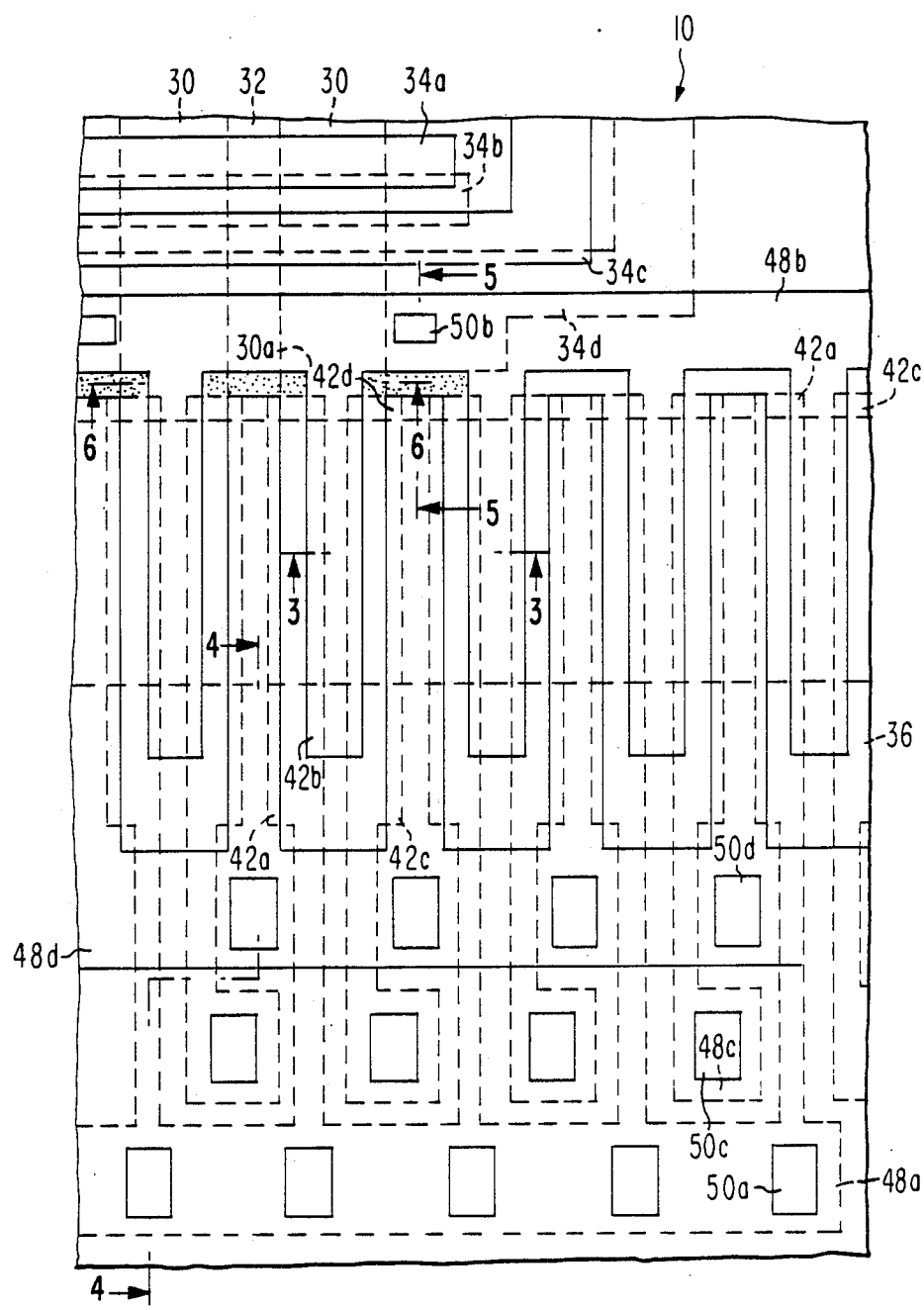
FIG. 2 is a top plan view of a portion of a CCD imager which incorporates the present invention.

As shown in FIGS. 1 and 2, the B-register 14 includes a plurality of spaced, parallel channel regions 30 of N type conductivity within the substrate 20 and extending along the surface 18. Each of the B-register channels 30 is co-extensive with and extends from a separate A-register channel 22. Between the B-register channels 30 are channel stop regions 32 of P type conductivity. Each of the B-register channel stops 32 is co-extensive with and extends from a separate one of the A-register channel stop regions 24.

The B-register 14 also includes a plurality of conductive gates extending transversely across the channel regions 30 and insulated from the substrate surface 18 by a thin layer of silicon oxide. The CCD imager 10 shown is a four phase CCD. Thus, as shown in FIG. 2, the gates of the B-register are arranged in sets of four gates 34a, 34b, 34c and 34d. As will be explained in more detail later, the gates 34a, 34b, 34c and 34d are formed from two separate layers of the conductive material, preferably doped polycrystalline silicon, with the gates 34b and 34d being formed from the first layer of the conductive material, and the gates 34a and 34c being formed from the second layer. Where the gates 34a and 34c overlap the edges of gates 34b and 34d they are insulated from each other by a thin layer of silicon oxide. In the A-register, the gates are likewise formed in sets of four with two of the gates of each set being formed from one layer of the conductive material and the other two gates of each set being formed from the second layer of the conductive material.

Figure 3:
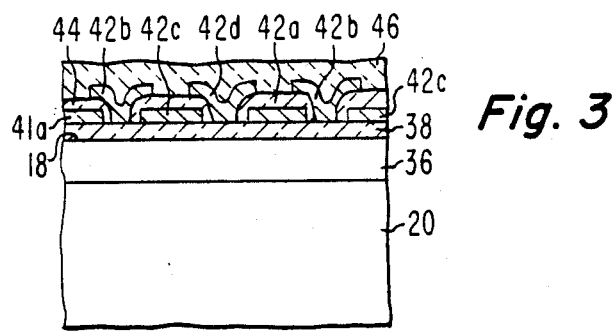
FIG. 3 is a sectional view taken along line 3—3 of FIG. 2.

As shown in FIGS. 1 and 2, the C-register 16 includes a channel region 36 which extends transversely across the ends of the B-register channel regions 30. As shown in FIG. 3, the C-register channel region 36 is a region of N type conductivity within the substrate 20 and extending along the surface 18. The N type region forming the C-register channel region 36 is an extension of the N type regions forming the B-register channel regions 30.

Figure 4:
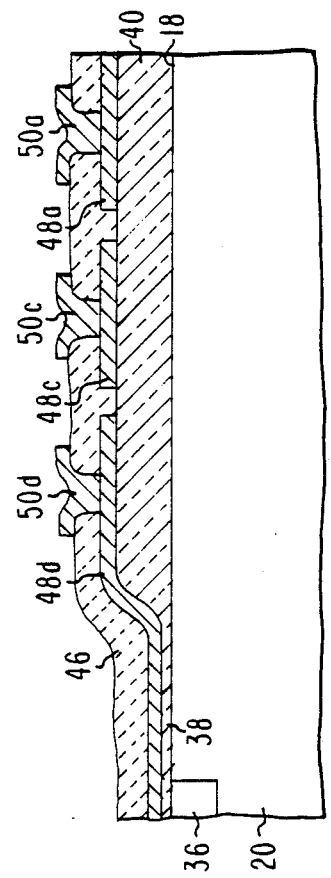
FIG. 4 is a sectional view taken along line 4—4 of FIG. 2.

As shown in FIGS. 3 and 4, a thin layer 38 of silicon oxide is on the substrate surface 18 over the C-register channel region 36. A thicker field oxide layer 40 is on the substrate surface 18 along the side of the C-register channel 36 away from the B-register 14. The thin channel region oxide layer 38 is the same oxide layer which extends across the A-register 12 and B-register 14. The field oxide layer 40 extends completely around the CCD imager 10 along both sides of the A-register 12 and B-register 14.

As shown in FIGS. 2 and 3, a plurality of conductive gates 42, such as of conductive polycrystalline silicon, are on the thin silicon oxide layer 38 and extends transversely across the C-register channel region 36 substantially parallel to the B-register channel regions 30. The C-register gates 42 are also arranged in sets of four gates 42a, 42b, 42c and 42d. As shown in FIG. 3, the gates 42a and 42c are formed from a first layer of the conductive material and the gates 42b and 42d are formed from a second layer of the conductive material which extends between the gates 42a and 42c and partially overlaps each of the adjacent gates 42a and 42c. Where the gates 42b and 42d overlap the adjacent gates 42a and 42c, they are insulated from each other by a thin layer 44 of silicon oxide which covers the gates 42a and 42c. The gates 42 are coated with a reflow-glass layer 46 of an insulating material, such as a phosphorous silicate glass. The reflow-glass layer 46 also extends over the gates of the A-register 12 and B-register 14.

As shown in FIGS. 2 and 4, all of the gates 42d extend to a termination strip 48d of the conductive material which extends over the thick field oxide layer 40 along the side of the C-register channel region 36 opposite the B-register 14. A plurality of metal contacts 50d extend through the protective layer 46 to the termination strip 48d. The contacts 50d are spaced along the termination strip 48d with each contact 50d being aligned with a separate one of the gates 42d.

Each of the gates 42c extends to a separate termination pad 48c which is over the thick field oxide 40. The termination pads 48c are arranged in a row along the side of the termination strip 48d away from the C-register channel region 36. A separate metal contact 50c extends through the protective layer 46 to each of the termination pads 48c.

Each of the gates 42a extends to a termination strip 48a of the conductive material which is on the thick field oxide layer 40. The termination strip 48a extends parallel to the C-register channel region 36 on the side of the termination pads 48c away from the channel region 36. A plurality of metal contacts 50a extends through the protection layer 36 to the termination strip 48a. The contacts 50a are spaced along the termination strip 48a with each contact 48a being aligned with a separate one of the gates 42a.

Figure 5:
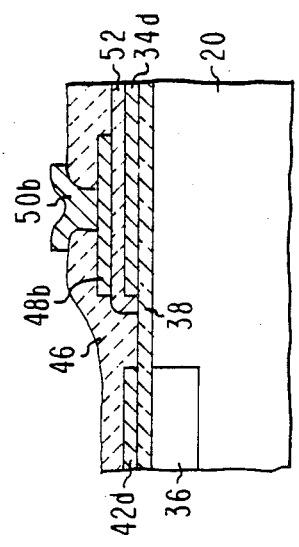
FIG. 5 is a sectional view taken along line 5—5 of FIG. 2.

The gates 42b all extend to a termination strip 48b of the conductive material. The termination strip 48b extends substantially parallel to the C-register channel region 36 along the side of the channel region 36 over the B-register 14. As shown in FIGS. 2 and 5, a portion of the termination strip 48b extends over a portion of the B-register gate 34d and is insulated therefrom by a thin layer 52 of silicon oxide. A plurality of spaced metal contacts 50b extends through the reflow-glass layer 46 to the termination strip 48b. The openings through the reflow-glass layer 46 for the contacts 50b are positioned on the portion of the termination strip 48a which is over the B-register gate 34d. Thus, the contacts 50b are not formed directly over the thin channel oxide layer 38. Thus, one of the termination strips is over the B-register 14 while the other termination strips or pads are along the side of the C-register channel region 36 away from the B-register 14 so as to permit all of the gates to be terminated in a minimum amount of space.

Figure 6:
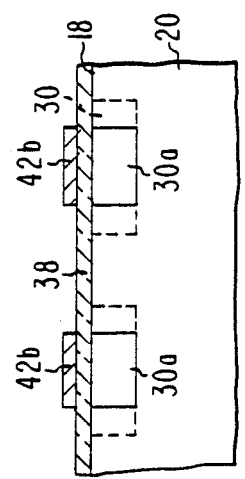
FIG. 6 is a sectional view taken along line 6—6 of FIG. 2.

As shown in FIGS. 2 and 6, each of the B-register channel regions 30 has a narrow portion 30a at its end at the C-register channel region 36. The narrow portion 30a of each B-register channel region 30a is of the same width and extends directly under a gate 42b of the C-register 16 so as to be completely aligned with the gate 42b. By having the end portion 30a of the B-register channel region 30 aligned with the C-register gate 42b, there is no exposed portion of the B-register channel region which can trap charge and prevent the charge from being transferred to the C-register channel region 36.

For a dense CCD imager typical dimensions for the device would be 8 micrometers wide buried channel regions in the A-register and B-register with 4 micrometers channel stop regions between the channel regions. The gates in all of the registers would be 4 micrometers wide with an overlap of 1 micrometer. This provides a pixel area in the A-register of 12 micrometers by 12 micrometers.

The CCD imager 10 is made by growing on the surface 18 of the substrate 20 of single crystalline silicon of P type conductivity a thin layer (about 400 angstroms) of silicon oxide. The silicon oxide layer is grown on the substrate 20 by exposing the substrate to water vapor at a temperature of about 800° C. for about one hour. A thicker layer (about 2500 angstroms) of silicon nitride is then deposited on the silicon oxide layer. The silicon nitride layer is deposited by standard chemical vapor deposition techniques from a mixture of silane and ammonia heated to about 800° C. Using standard photolithographic tecnhiques and plasma etching, openings are formed in the silicon nitride layer where the field oxide layer 40 is to be found. The substrate 20 is then exposed to a mixture of water vapor and a chlorine containing material at a temperatures of about 1100° C. for about 90 minutes to grow a thick (about 8500 angstroms) field oxide layer on the areas of the substrate surface 18 not covered by the silicon nitride layer. The silicon nitride layer is then removed with a suitable etchant and the initial thin layer of silicon oxide is removed from the substrate surface with a suitable etchant.

A layer of a photoresist is coated over the substrate surface and the field oxide layer and, using standard photolithographic techniques, is defined to form openings therein over the areas of the substrate surface 18 where the blooming drain regions 26 of the A-register 12 are to be formed. The areas of the silicon oxide layer exposed by the openings in the resist layer are then etched to form openings in the silicon oxide layer to the substrate surface 18. Ions of N type conductivity material, such as arsenic, are then implanted into the exposed areas of the substrate surface 18 to form the blooming drain regions 26 in the substrate 20. The resist layer is removed and a new layer of photoresist is coated over the substrate surface. Using standard photolithographic techniques, openings are formed in the resist layer where the channel stop regions 24 are to be formed. Ions of a material of P type conductivity, such as boron, are then implanted into the exposed areas of the substrate surface 18 through the openings in the resist layer. This defines the channel stop region 24.

The resist layer is removed and another layer of photoresist is coated over the substrate surface. Using standard photolithographic tecnhiques, openings are formed in the resist layer over the area of the substrate surface where the A-register 12, B-register 14 and C-register 16 are to be formed. Ions of an N type conductivity material, such as phosphorus, are then implanted in the substrate 20. In the A-register 12, this forms the channel regions 22 and channel stop regions 24. In the B-register 14 and C-register 16 this forms the channel regions 30 and 36, respectively. After removing the photoresist, the thin silicon oxide layer 38 is then grown on the exposed substrate surface 18 in the A-register 12, B-register 14 and C-register 16 by heating the substrate 20 in an atmosphere of water vapor and a chlorine containing material at about 900° C.

A first layer of polycrystalline silicon is then deposited over the thin oxide layer 38 and the thicker field oxide layer 40. The polycrystalline silicon layer may be deposited by a chemical vapor deposition technique using silane ($SiH_4$). The polycrystalline silicon layer is then doped, generally with phosphorus, to make it conductive. This may be achieved by ion implantation or exposing the polycrystalline silicon layer to $POCl_3$ at 900° C. The first polycrystalline silicon layer is then defined, using standard photolithographic techniques and either chemical or plasma etching to form two sets of gates and their related termination strips or pads in each of the registers. In the C-register 16, the gates 42a and 42c and their respective termination strips or pads 48a and 48c and formed from the first polycrystalline silicon layer. In the B-register 14, the gates 34b and 34d and their related termination strips are formed from the first polycrystalline silicon layer. Similarly, in the A-register 12, two sets of the gates are formed from the first polycrystalline silicon layer. During the etching of the polycrystalline silicon layer to form the gates, some of the thin oxide layer 38 which is between the gates may also be removed. Silicon oxide is the thermally grown over the defined gates and any exposed portions of the substrate surface to form the spacer layer 44 in the C-register 16 and spacer layer 52 in the B-register 16 and similar spacer layers in the A-register. This also reforms the final thickness of the silicon oxide on the surface 18 of the substrate 20 between the gates.

A second layer of polycrystalline silicon is then deposited on the silicon oxide spacer layers and exposed surface of the silicon oxide layer 38. After the second polycrystalline silicon layer is doped, it is defined, using standard photolithographic techniques and etching, to form the remaining gates and their termination strips or pads. In the C-register 16 this forms the gates 42b and 42d and their related termination strips 48b and 48d. In the B-register 14, this forms the gates 34a and 34c and their related termination strips, and in the A-register 12 two sets of gates are similarly defined.

A layer of a photoresist is then coated over the three registers, and, using standard photolithographic techniques, is defined to form an opening therethrough over the area of the substrate surface 18 where the B-register channel regions 30 meet the C-register channel region 36. As can be see in FIG. 2, there are opened areas between the ends of the C-register gates 42a, 42c, 42d and the edge of the termination strip 48b across which the wide B-register channel regions 30 project beyond the sides of the gates 42b so as to be uncovered by the gates. Using the polycrystalline silicon gates 42a, 42b, 42c and 42d and the termination strip 48b as masks, ions of a P type conductivity modifier, such as boron, are implanted through these openings into the substrate 20 to convert the uncovered portions of the B-register channel regions 30 to P type conductivity. Thus, the end portions 30a of the N type B-register channel regions 30 are made to conform and be self-aligned with the gates 42b and to be positioned directly under the gates 42b.

After removing the resist layer, the reflow-glass layer 46 of phosphosilicate glass is then coated over the entire device. This may be achieved by the chemical vapor deposition method described in the U.S. Pat. No. 3,481,781, of W. Kern issued Dec. 2, 1969, entitled "Silicate Glass Coating of Semiconductor Devices", which is incorporated herein by reference. A layer of a resist is coated over the reflow-glass layer 46 and is defined using standard photolithographic techniques to have openings therein over the areas where the various contacts are to be provided, such as the contacts 50a, 50d, 50c and 50d. The portions of the reflow-glass layer 46 exposed in the openings in the resist layer are then removed using a suitable etchant to expose the various termination strips and termination pads. After heating the reflow-glass layer 46 to cause it to reflow and have a smooth surface, a metal is then coated in these openings, such as by evaporation in the vacuum or by sputtering, to form the various contacts.

Figure 7:
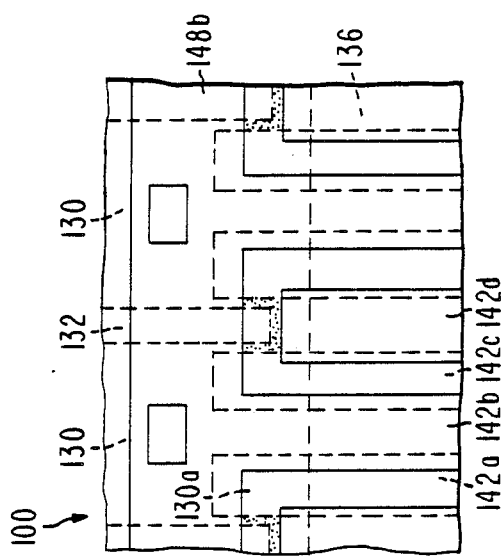
FIG. 7 is a top plan view of a portion of a CCD imager which incorporates a modification of the present invention.

Referring to FIG. 7, there is shown a portion of a modification of the CCD imager of the present invention, generally designated as 100, at the interface between the B-register and the C-register. The CCD imager 100 is of the same structure as the CCD imager 10 shown in FIGS. 2-6 except that the C-register gates 142a and 142c which are formed from the first layer of conductive material are wider than the corresponding gates 42a and 42c of the CCD imager 10. The gates 142a and 142c are sufficiently wide to extend under the termination strip 148b for the gates 142b. As can be seen by comparing FIG. 7 with FIG. 2, this greatly reduces the area, the stippled area, of the B-register buried channel regions 130 that is uncovered by the C-register gates and which is converted to P-type conductivity by the implantaion step following the formation of the gates. In fact, in the CCD imager 100, such uncovered areas of the B-register channel regions 130 are mainly the result of misalignment of the masks used in forming the C-register gates. Also, the B-register channel stop regions 132 do not have to extend completely to the C-register channel region 136. The step of implanting P-type conductivity modifiers will automatically extend the channel stop regions 132 to the ends of the C-register gates. Thus, the B-register channel stop regions 132 will be self-aligned with the C-register gates.

Reducing the area of the B-register channel regions 130 which are converted to eliminate charge trapping pockets has a number of advantages. It is desirable to have the B-register channel regions 130 of uniform width for better transfer of charges therealong. Since less of the end portions of the B-register channel region 130 is converted to P- type conductivity, the end portions 130a of the B-register channel regions 130 are substantially wider than the end portions 30a of the B-register channel regions 30 and thus provide for better transfer of charge to the C-register channel region 136. Also, the B-register channel regions 130 can be made wider, for example 10 micrometers wide, with narrow channel stop regions 132, 2 micrometers, therebetween. As shown in FIG. 7, the end portion 130a of the end of the B-register channel regions 130 extends under three C-register gates 142a, 142b and 142c. Thus charge can be transferred from the B-register channel region 130 to the C-register channel region 136 by applying a potential to all of the three gates 142a, 142b and 142c leaving the fourth gate 142d turned off to serve as a barrier between the charges from the respective B-register channel region 130.

Thus, there is provided by the present invention, a CCD imager in which the gates can be very narrow and have a plurality of gates per set. In the C-register of the CCD imager the termination for at least one gate of each set is over the adjacent portion of the B-register while the terminations for the other gates are along the side of the C-register opposite to the B-register. This allows the formation of a plurality of terminations in a minimum amount of area of the CCD imager. In addition, the present invention provides a method of making the CCD imager wherein the end portions of the B-register channel regions at the C-register channel region are made to conform to, and be self-aligned with, the narrow gates of the C-register to eliminate any charge trapping pockets and achieve good transfer of charges from the B-register channel regions to the C-register channel.

We claim:

1. In a charge-coupled device imager which includes in a substrate of semiconductor material of one conductivity type, a first register having a plurality of spaced, parallel buried channel regions of a conductivity type opposite to that of the substrate in the substrate and extending along a surface of the substrate and a plurality of conductive gates extending transversely across the channel regions and insulated from the substrate surface and a second register having a buried channel region in the substrate and extending along said substrate surface substantially perpendicular to and across the ends of the first region channel regions and a plurality of conductive gates extending transversely across the second register channel region substantially parallel to the first register channel regions and insulated from said substrate surface, the conductive gates of said second register being arranged in a plurality of sets with a plurality of gates in each set, one gate of each set extending to a common conductive termination which is along the side of the second register channel region over and insulated from the first register and the gates of the other sets extending to conductive termination which is along the side of the second register channel region opposite to the first register, the improvement comprising, the termination strip is of conductive polycrystalline silicon, at least a portion of said termination strip extends over a portion of a conductive gate of said first register, a layer of silicon oxide extends between the overlapping portions of said termination strip and the said conductive gates of the first register, and a plurality of metal contacts are spaced along the portions of the termination strip which is over the conductive gate of the first register.

2. An imager in accordance with claim 1 in which the conductive gates are of conductive polycrystalline silicon.

3. An imager in accordance with claim 2 in which each set of gates of the second register includes three gates with the one gate of each set extending to a common conductive termination strip over the first register, a second gate of each set extending to a common conductive termination strip at the side of the second register channel region opposite the first register and the third gate of each set extending to a separate conductive termination on the side of the second register channel region opposite the first register, a plurality of metal contacts are spaced along each of the termination strips and a separate metal contact is on each of the terminations of the third gates.

4. An imager in accordance with claim 2 in which some of the gates of each set in each register are part of a first conductive layer and the other gates of each set are part of a second conductive layer with the gates of the second conductive layer extending between the gates of the first conductive layer.

5. An imager in accordance with claim 4 in which the one gate of each set which extends to a termination over the first register is part of the second conductive layer.

6. An imager in accordance with claim 5 in which the termination for said one gate of each set is a strip of said second conductive layer which extends substantially parallel to the second register channel region.

7. An imager in accordance with claim 6 in which the gates which are part of the first conductive level extend under the termination strip of said one gates.

* * * * *